(12) United States Patent
Grajcar

(10) Patent No.: US 8,400,771 B2
(45) Date of Patent: Mar. 19, 2013

(54) APPARATUS AND METHODS FOR THERMAL MANAGEMENT OF ELECTRONIC DEVICES

(75) Inventor: Zdenko Grajcar, Crystal, MN (US)

(73) Assignee: Nexxus Lighting, Inc., Charlotte, NC (US)

( * ) Notice: Subject to any disclaimer, the term of this patent is extended or adjusted under 35 U.S.C. 154(b) by 0 days.

(21) Appl. No.: 13/004,327

(22) Filed: Jan. 11, 2011

(65) Prior Publication Data

US 2011/0110059 A1    May 12, 2011

Related U.S. Application Data

(63) Continuation of application No. 12/256,914, filed on Oct. 23, 2008, now Pat. No. 7,911,797.

(60) Provisional application No. 61/000,521, filed on Oct. 25, 2007.

(51) Int. Cl.
    *H05K 7/20*      (2006.01)

(52) U.S. Cl. ....... 361/719; 165/80.2; 165/185; 361/704; 361/707

(58) Field of Classification Search .................. 361/719
See application file for complete search history.

(56) References Cited

U.S. PATENT DOCUMENTS

| | | | |
|---|---|---|---|
| 3,764,856 A | | 10/1973 | Martin |
| 4,823,234 A | * | 4/1989 | Konishi et al. ............ 361/718 |
| 5,113,315 A | * | 5/1992 | Capp et al. ............... 361/704 |
| 5,469,330 A | * | 11/1995 | Karabatsos et al. ......... 361/704 |
| 5,659,458 A | * | 8/1997 | Patchen .................. 361/704 |
| 5,933,324 A | * | 8/1999 | Barrett .................... 361/703 |
| 6,407,923 B1 | | 6/2002 | Gerlock et al. |
| 6,466,440 B2 | | 10/2002 | Kaneko |
| 6,706,972 B1 | * | 3/2004 | Martin ..................... 174/260 |
| 6,840,794 B2 | | 1/2005 | Chiu |

(Continued)

FOREIGN PATENT DOCUMENTS

| | | |
|---|---|---|
| EP | 1843403 A2 | 10/2007 |
| GB | 2335075 | 9/1999 |

(Continued)

OTHER PUBLICATIONS

Extended European Search Report and Supplementary European Search report and European Search opinion mailed Nov. 19, 2010 for European Patent Application No. 08840873.7.

*Primary Examiner* — Gregory Thompson
(74) *Attorney, Agent, or Firm* — Baker & Hostetler, LLP

(57) ABSTRACT

An apparatus is disclosed that may include a printed circuit board (PCB) and an electronics package may be disposed about the first surface of the PCB. The PCB may include a metal layer and a core, and, in some aspects, may include multiple cores interposed between multiple metal layers, and in some embodiments a backplane may be disposed along the core. The metal layer may be disposed on a core first surface. The metal layer may comprise metal or other conductive material suitable to define traces, which may be circuit paths for electronic components affixed to the PCB. In some aspects, the core may be electrically non-conducting, and may be thermally insulating, and, accordingly, inhibit the transfer of heat from the electronics package through the PCB. However, pins may be configured to pass through the PCB including the core from the core first surface to the core second surface to conduct heat generated by the electronics package away for dispersion. In some embodiments, the pins may pass into the backplane. A pad may be disposed between the electronic package and the core in some embodiments, the pins passing into the pad.

17 Claims, 11 Drawing Sheets

U.S. PATENT DOCUMENTS

| | | | |
|---|---|---|---|
| 6,992,899 B2 * | 1/2006 | Alger et al. | 361/767 |
| 7,265,983 B2 * | 9/2007 | Frisch | 361/719 |
| 7,521,789 B1 * | 4/2009 | Rinehart et al. | 257/699 |
| 7,532,479 B2 * | 5/2009 | Ohno et al. | 361/719 |
| 2003/0150605 A1 * | 8/2003 | Belady et al. | 165/185 |
| 2005/0041396 A1 * | 2/2005 | Nurminen | 361/719 |
| 2006/0007661 A1 | 1/2006 | Iketaki | |
| 2006/0018099 A1 | 1/2006 | Chen | |

FOREIGN PATENT DOCUMENTS

| | | |
|---|---|---|
| JP | 6318486 A | 11/1994 |
| JP | 10133608 A | 5/1998 |
| JP | 2003178602 A | 6/2003 |
| WO | 81/03734 | 12/1981 |
| WO | 2007/091832 | 8/2007 |

* cited by examiner

APPARATUS AND METHODS FOR THERMAL MANAGEMENT OF ELECTRONIC DEVICES

CROSS-REFERENCE TO RELATED APPLICATIONS

This application is a continuation of U.S. application Ser. No. 12/256,914 filed on Oct. 23, 2008 now U.S. Pat. No. 7,911,797 which claims the benefit of U.S. Provisional Patent Application No. 61/000,521 filed on Oct. 25, 2007, the disclosure of each are incorporated by reference herein in their entirety.

BACKGROUND OF THE INVENTION

1. Field of the Invention

The invention is directed generally to a method and apparatus for the thermal management of heat in electronic devices and, more particularly, to having printed circuit boards. Apparatus and methods in accordance with the present inventions may resolve many of the needs and shortcomings discussed above and will provide additional improvements and advantages that may be recognized by those of ordinary skill in the art upon review of the present disclosure.

2. Related Art

Numerous electronic manufacturing techniques have attempted to deal with component placement on printed circuit boards (PCB) so that costs tend to be minimized for producing electronic products. For many products, the types of electronic components involved may dictate particular layouts and the use of special arrangements to minimize heat build-up in the circuitry and components during use. However, there tends to be a limit to the effectiveness of the heat removal capabilities of current techniques, which might suppress progress in producing new products that have higher heat removal needs.

Accordingly, there is a need for a method and apparatus that provides improved heat dissipation techniques for printed circuit boards of various types so that components that produce more heat may be accommodated.

SUMMARY OF THE INVENTION

The invention meets the foregoing need and provides a method and apparatus for thermal management in electronic devices and that furthermore includes other advantages apparent from the discussion herein. Moreover, the invention is directed to a method and device for thermal management in electronic devices with printed circuit boards (PCB). The apparatus may include a PCB. The PCB may define a first surface and a second surface, and the PCB includes a metal layer and a core. The core may define a first core surface and a second core surface. The metal layer may be secured to the first core surface. The apparatus may include an electronics package, and the electronics package is secured to the first surface of the PCB. The apparatus includes a plurality of pins, each pin in the plurality of pins having a first end and a second end. The pins may be disposed about the PCB with the first ends generally proximate the electronics package such that heat generated by the electronics package may be received by the pins generally proximate the first ends. The pins may pass through the core generally from the first core surface to the second core surface to conduct heat generated by the electronics package through the core as heat is conducted from the first end toward the second end of the pins.

The invention may be implemented in a number of ways. According to one aspect of the invention a circuit is provided that may include a printed circuit board (PCB), the PCB may define a first surface and a second surface, the PCB may include a core, the core may define a first core surface and a second core surface, an electronics package, the electronics package secured to the first surface of the PCB and a plurality of pins, each pin of the plurality of pins having a first end and a second end, the pins disposed about the PCB with at least one of the first ends proximate the electronics package such that a portion of the heat generated by the electronics package may be received by at least one of the pins, the pins configured to pass through the core generally from the first core surface to the second core surface to conduct the portion of the heat generated by the electronics package through the core for dissipation.

In another aspect of the invention, a method of dissipating heat in a circuit is provided that includes providing a printed circuit board (PCB), the PCB defining a first surface and a second surface, the PCB including a core, the core defining a first core surface and a second core surface, providing an electronics package, the electronics package being secured to the first surface of the PCB and providing a plurality of pins, each pin of the plurality of pins having a first end and a second end, the pins being disposed about the PCB with the first ends proximate the electronics package such that at least a portion of the heat generated by the electronics package are received by the pins, the pins configured to pass through the core generally from the first core surface to the second core surface to conduct at least a portion of heat generated by the electronics package through the core for dissipation.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention as claimed.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and the various ways in which it may be practiced. In the drawings.

DETAILED DESCRIPTION OF THE INVENTION

Figure 1A:
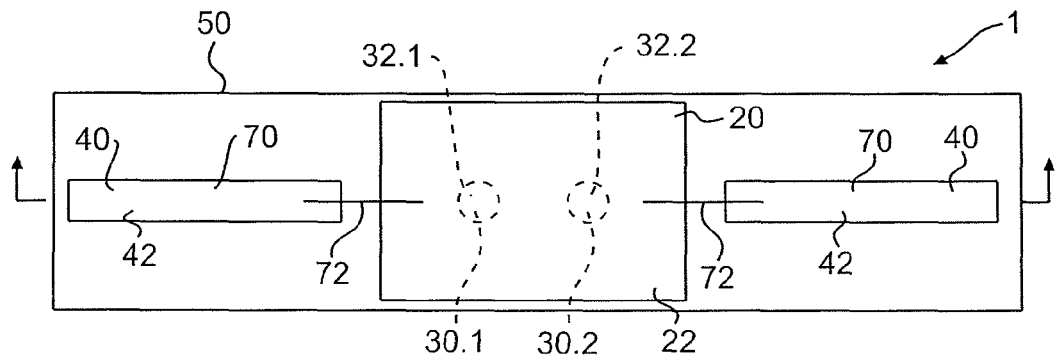
FIG. 1A illustrates in plan view an exemplary embodiment of an apparatus, configured according to principles of the invention.

The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals represent similar parts throughout the several views of the drawings.

Referring now to the various embodiments of the Figures, in various aspects, the apparatus 1 may include a printed circuit board (PCB) 10, which defines a first surface 12 and a second surface 14. An electronics package 20 may be disposed about the first surface 12 of the PCB 10, and the electronics package 20 may generate heat. The PCB 10 may include a metal layer 40 and a core 50, and, in some aspects, may include multiple cores 50 interposed between multiple metal layers 40. The metal layer 40 may be disposed on a core first surface 52 of the core 50. The metal layer 40 may include metal such as copper, silver, gold, other metal, or other conductive material or combinations thereof suitable to define traces 70, which are circuit paths for electronic components affixed to the PCB 10. The core 50 may include any of the well known and electrically non-conducting materials commonly used in PCB manufacture such as FR4. As the core 50 may be electrically non-conducing, the core 50 may be thermally insulating, and, accordingly, inhibit the transfer of heat from the electronics package 20 through the PCB 10.

The apparatus 1 may include one or more pins 30. Each pin 30 has a first end 32 and a second end 34, and is formed from heat conductive material or combinations of heat conductive materials, a plurality of pins 30 may be disposed about the PCB 10 with first ends 32 generally proximate the electronics package 20 and configured to conduct heat away from the electronics package 20. The pins 30 configured with an orientation to pass generally through the PCB from the first surface 12 to the second surface 14, with the first ends 32 of the pins 30 configured to be positioned generally proximate the electronics package 20 to provide paths for heat conduction from the electronics package 20 through the core 50 of the PCB 10. In certain aspects, portions of the pin 30 including the second end 34 may extend generally beyond the second surface 14 of the PCB to define an extension 36. The extension 36 may disperse heat by convection and/or radiation. In such aspects, a plurality of pins 30 may include extensions 36 to form an array 120 which may further enhance heat dispersal.

In various aspects, the PCB 10 may include a backplane 60 with the backplane first surface 62 generally affixed to the core second surface 54 as shown in FIGS. 4B, 5B, 6B, 8B, 9 and 10. The backplane 60 may be comprised of a metal such as copper, aluminum, graphite, other conductive material, or combinations thereof. The backplane 60 may function, among other things, to provide a common potential for circuitry attached to the PCB 10 and/or to serve as a heat spreader to diffuse heat generated by the operation of the circuitry attached to the PCB 10 including the electronics package 20. As such, the backplane 60 may be electrically conductive and/or may be thermally conductive.

In embodiments of the PCB 10 that include the backplane 60, portions of the pins 30 may be configured to extend into at least portions of the backplane 60 in order to transfer heat from the pins 30 into the backplane 60 for dispersal. The pins 30 may be configured to extend into the backplane 60 to secure, at least in part, the backplane 60 to the core 50. In particular, the backplane 60 may include, at least in part, graphite, and the pins 30 may be configured to secure such a graphite backplane 60 to the core 50.

Each pin 30 may be a generally elongated member such as a nail, screw, bolt, strip, pin, or the like, and may be configured to conduct heat between the first end 32 and the second end 34. Accordingly, each pin 30 may be formed of copper, brass, steel, or various other metals, metal alloys, or other heat conductive materials, or combinations thereof. The pin 30 may have a generally constant cross-section between the first end 32 and the second end 34 or may be, at least in part, tapered between the first end 32 and the second end 34. The cross-section of the pin 30 maybe substantially cylindrical, in some aspects, while, in other aspects, the pin 30 may have, for example, a polygonal cross-section such as rectangular or hexagonal cross-section. In still other aspects, the pin 30 may have a star shaped cross-section. In other aspects, the pin 30 may be flattened proximate the second end 34, perhaps enlarged, to provide a relatively larger surface area to increase heat dissipation. Portions of the pin 30 generally proximate the first end 32 may form a head 31, which could be, for example, either flat or rounded. Portions of the pin 30 generally proximate the second end 34 may generally define a point 33. In some aspects, the pin 30 may be configured to be driven into the PCB 10 by the application of force about the first end 32. In other aspects, the pin 30 may include threads and/or configured to be threadedly received into the PCB 10. In still other aspects, the pin 30 may be configured to be slidably received in a channel or other aperture associated with the PCB 10. The pin 30 may have various geometric configurations, include various materials, and may be placed in the PCB in various ways as would be recognized by those of ordinary skill in the art upon review of this disclosure. Combinations of pins 30 having various lengths, materials, and/or geometries could be used in some aspects.

The extension 36 may extend generally beyond the backplane second surface 64 to disperse heat. Heat may be dispersed from the extension 36 by free convection and/or forced convection, as well as by radiation. In various aspects, a plurality of extended portions 36 may be configured to form an array 120, and the array 120 may dissipate heat by free convection and/or forced convection. In contrast to fins or other such structures, air may flow through the array 120 in multiple directions to convect heat from the array 120. As would be understood by those of ordinary skill in the art upon review of this disclosure, additional components such as, for example, fins for heat dispersion and structural members may be secured to the backplane second surface 64, and the additional components may be secured, at least in part, by one or more pins 30. Also, as would be understood by those of ordinary skill in the art upon review of this disclosure, various welds, adhesives, solders, and other mechanisms of attachment may be provided to secure various portions of the PCB 10 together, so that various adhesive and other layers may be interposed between the components in various aspects. For example, the core 50 may be adhesively secured to the backplane 60, which may interpose an adhesive layer generally between the core second surface 54 and the backplane first surface 62.

Figure 1B:
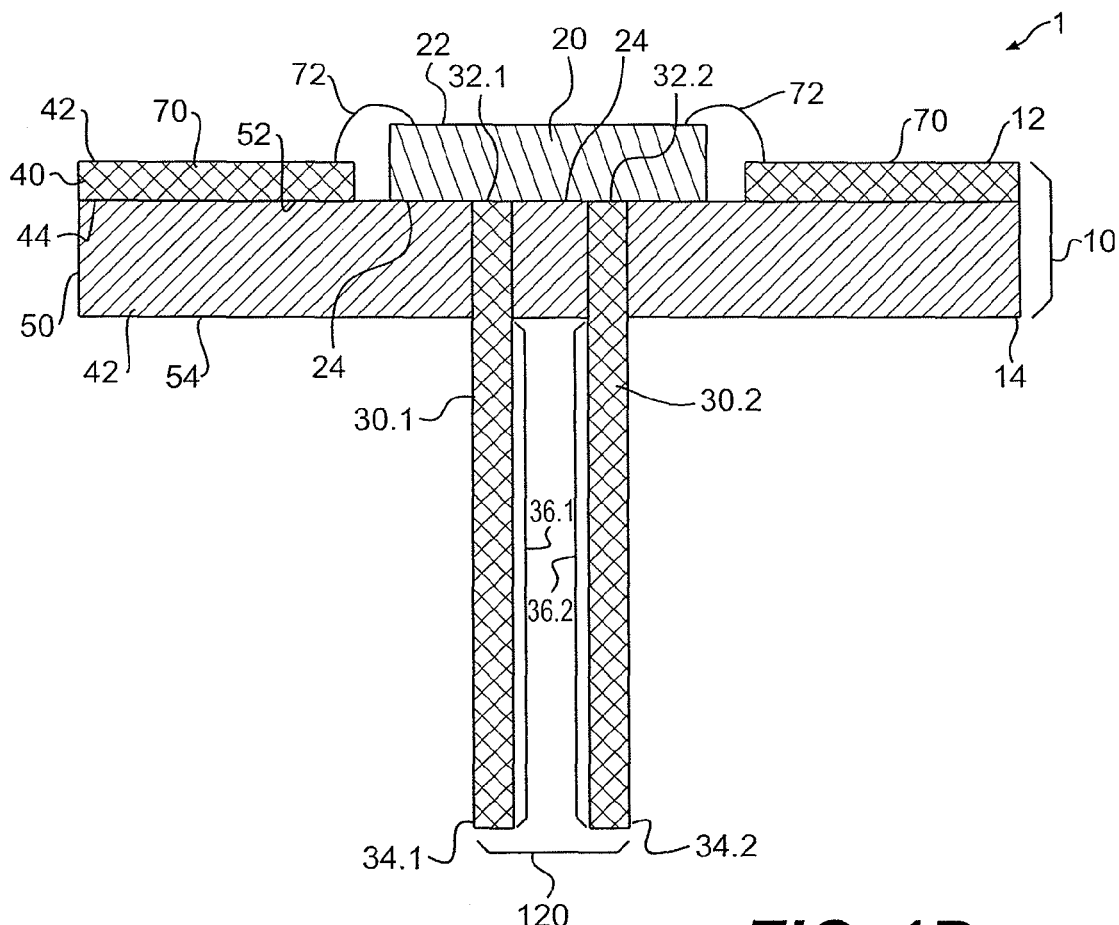
FIG. 1B illustrates a frontal view of the embodiment of FIG. 1A.

FIG. 1A illustrates in plan view an exemplary embodiment of an apparatus, configured according to principles of the invention and FIG. 1B illustrates a frontal view of the embodiment of FIG. 1A. A PCB 10 may include a metal layer 40 and a core 50. The metal layer first surface 42 and portions of the core first surface 52 generally define the first surface 12 of the PCB 10, and the second surface 14 of the PCB 10 is generally defined by the core second surface 54, as illustrated.

An electronics package 20 having a package first surface 22 and a package second surface 24 may be disposed about the first surface 12 of the PCB 10, as illustrated in FIGS. 1A and 1B, with portions of the package second surface 24 biased against portions of the core first surface 52. Traces 70 configured from the metal layer 40 may be disposed upon the core first surface 52, and the electronics package 20 may be in electrical communication with the traces 70 by electrical connectors 72, as illustrated. The electrical connectors 72 may be, for example, power leads, wire bonds, SMD leads, electrode pads, or the like.

As further illustrated in FIGS. 1A and 1B, pins 30.1, 30.2 may be configured to pass thru the PCB 10 including the core 50 from the core first surface 52 to the core second surface 54 to conduct heat generated by the electronics package 20, generally from the first surface 12 to the second surface 14. The first ends 32.1, 32.2 of pins 30.1, 30.2 may be placed proximate the core first surface 52 and proximate the package second surface 24 to receive heat from the package second surface 24 of the electronics package 30. In some embodiments, portions of the first ends 32.1, 32.2 may be generally biased against the package second surface 24. The pins 30.1, 30.2 may conduct the heat from the first ends 32.1, 32.2 through the core 50 from the core first surface 52 to the core second surface 54 and generally to the second ends 34.1, 34.2. As illustrated, portions of the pins 30.1, 30.2, generally proximate the second ends 34.1, 34.2, may protrude generally beyond the core second surface 54 to define extensions 36.1, 36.2. Heat conducted through the core 50 from the electronics package 20 may be dispersed, at least in part, by convection and/or radiation from the extensions 36.1, 36.2. The extensions 36.1, 36.2 may define the array 120, as illustrated. In other embodiments, the second ends 34.1, 34.2 may lie generally between the core first surface 52 and the core second surface 54, and/or may be generally proximate the core second surface 54 to disperse heat from the core second surface 54.

Figure 2A:
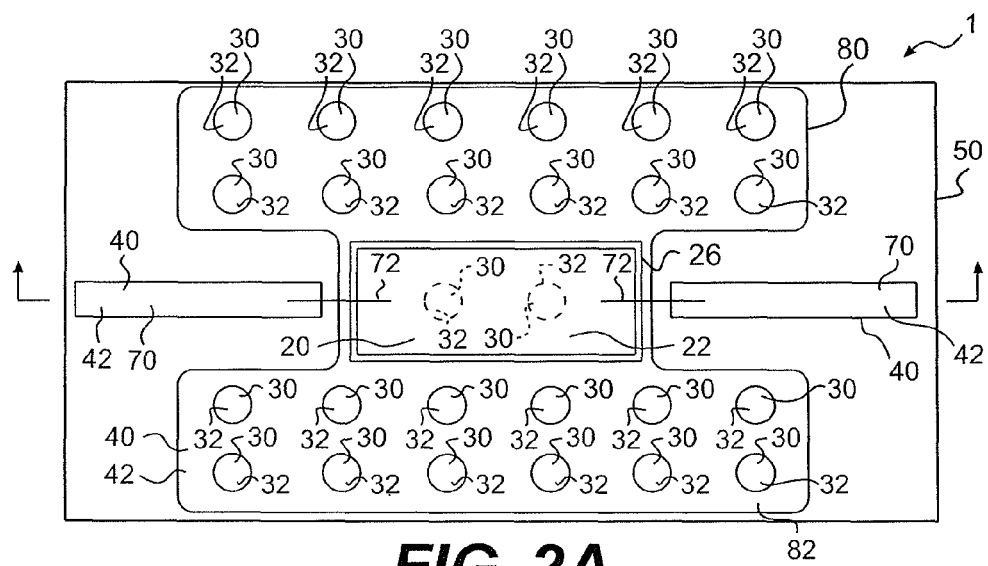
FIG. 2A illustrates in plan view an exemplary embodiment of an apparatus, configured according to principles of the invention.
Figure 2B:
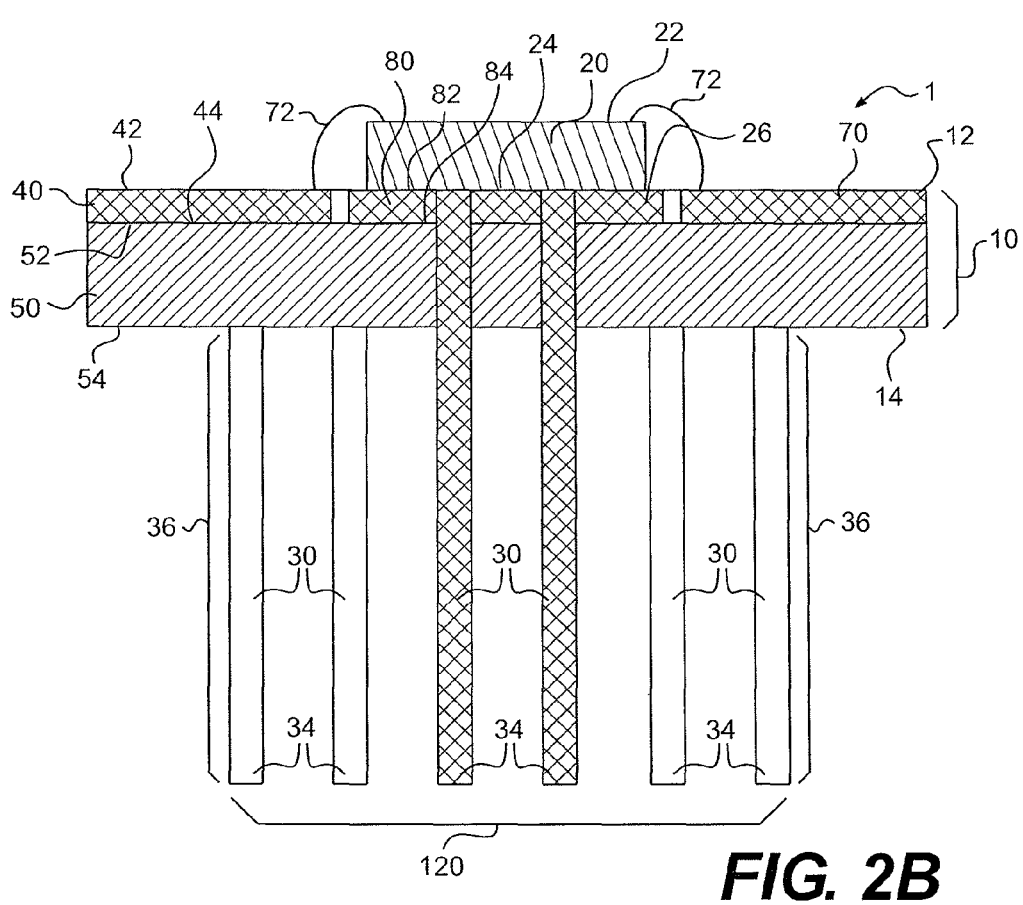
FIG. 2B illustrates in frontal view the embodiment of FIG. 2A.

FIG. 2A illustrates in plan view an exemplary embodiment of an apparatus, configured according to principles of the invention. FIG. 2B illustrates in frontal view of the embodiment of FIG. 2A. In FIGS. 2A and 2B, a PCB 10 that includes a metal layer 40 and a core 50 is generally illustrated. The metal layer 40 may include a first surface 42 and portions of the core first surface 52 may generally define the first surface 12 of the PCB 10. The second surface 14 of the PCB 10 may be generally defined by the core second surface 54, as illustrated. Reference numeral 44 is an interface between the metal layer 40 and the core 50.

As illustrated, portions of the metal layer 40 define traces 70. Other portions of the metal layer 40 may define a pad 80 having a pad first surface 82 and a pad second surface 84, with the pad 80 electrically isolated from the traces 70, as illustrated. The electronics package 20 may be disposed about the first surface 12 of the PCB 10, as illustrated in FIGS. 2A and 2B, with portions of the package second surface 24 generally abutting portions of the pad first surface 82, so that the electronics package 20 may be in thermal communication with the pad 80 to distribute heat from the electronics package 20 into the pad 80. The electronics package 20 may be in electrical communication with the traces 70 by electrical connectors 72, as illustrated.

As further illustrated in FIGS. 2A and 2B, a plurality of pins 30 may be configured to be disposed about the pad 80 to conduct heat from the pad 80 through the core 50. The pins 30 may pass through the PCB 10 including the pad 80 from pad first surface 82 to the pad second surface 84 and through the core 50 from the core first surface 52 to the core second surface 54 to conduct heat generally from the first surface 12 to the second surface 14. In this implementation, any heat generated by the electronics package 20 may be conducted from the package second surface 24 by the pad 80 and distributed to the pins 30 generally proximate the first ends 32 of the pins 30. The heat may be conducted through the core 50 from the core first surface 52 to the core second surface 54 by the pins 30, and the heat dispersed generally from the core second surface 54. As illustrated, heat conducted through the core 50 from the electronics package 20 may be dispersed, at least in part, by convection and/or radiation from the extensions 36 of the pins 30. In various implementations, the convective heat transfer from the array 120 formed by the extensions 36 may be either non-forced or forced.

In some implementations, at least some pins 30 may pass through the pad 80 from the pad first surface 82 to the pad second surface 84, and the first ends 32 may be generally proximate the pad first surface 82. In other implementations, at least some of the first ends 32 of the pins 30 may be generally proximate the pad second surface 84. In still other implementations, at least some of the first ends 32 of the pins 30 may be generally biased against the second surface 84 of the pad 80.

Figure 3A:
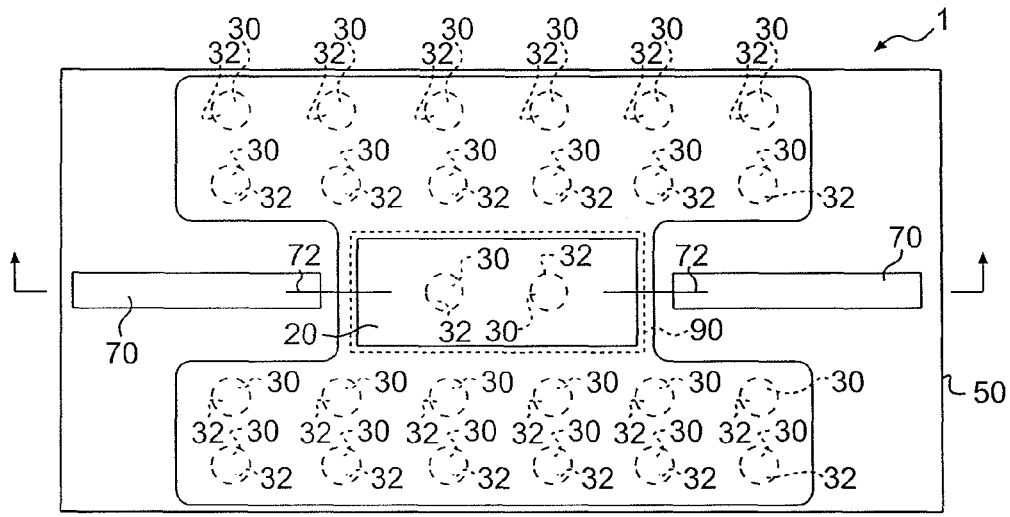
FIG. 3A illustrates in plan view an exemplary embodiment of an apparatus, configured according to principles of the invention.
Figure 3B:
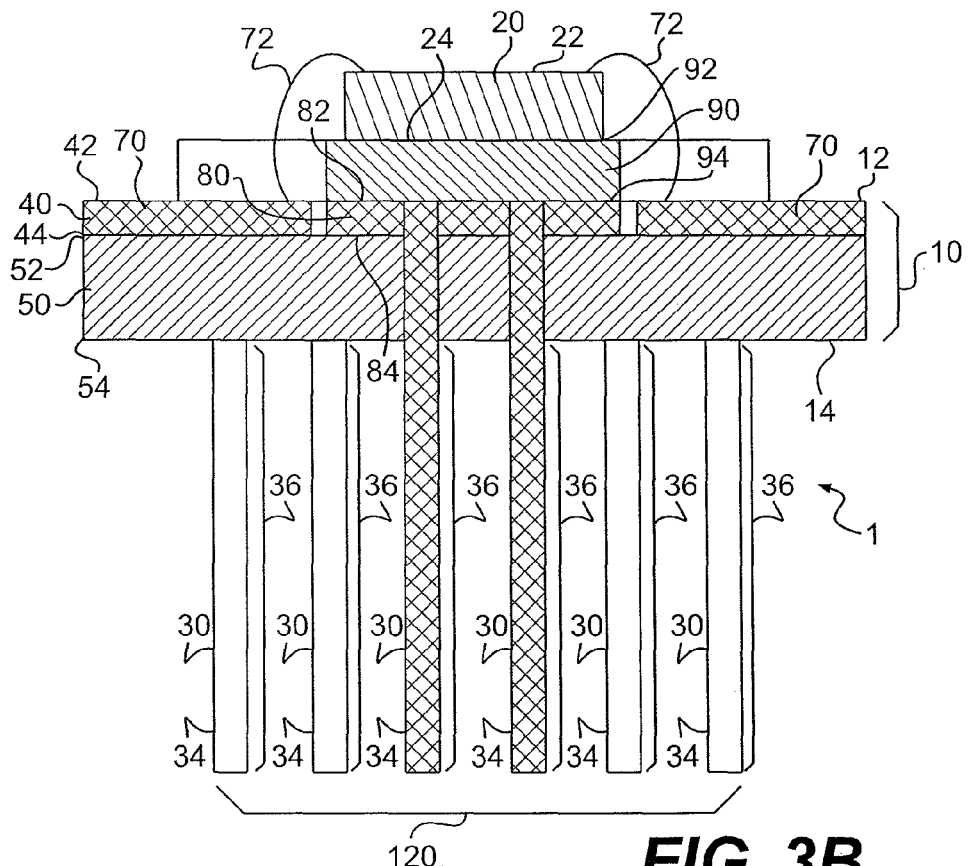
FIG. 3B illustrates in frontal view the embodiment of FIG. 3A.

FIG. 3A illustrates in plan view an exemplary embodiment of an apparatus, configured according to principles of the invention. FIG. 3B illustrates in frontal view of the embodiment of FIG. 3A. In FIGS. 3A and 3B, a PCB 10 that includes a metal layer 40 and a core 50 is generally illustrated. The metal layer first surface 42 and portions of the core first surface 52 may generally define the first surface 12 of the PCB 10. The second surface 14 of the PCB 10 may be generally defined by the core second surface 54, as illustrated.

Portions of the metal layer 40 may define traces 70, as illustrated. Other portions of the metal layer 40 may define a pad 80 having a pad first surface 82 and a pad second surface 84, with the pad 80 electrically isolated from the traces 70, as illustrated in FIGS. 3A and 3B. As illustrated, a heat slug 90 having a first heat slug surface 92 and a second heat slug surface 94 may be secured to the pad 80 with the second heat slug surface 94 is generally abutting the first pad surface 82. In this implementation, the shape of the second heat slug surface 94 may generally conform to the shape of the first pad surface 82. The electronics package 20 may be disposed about the first surface 12 of the PCB 10, as illustrated, with portions of the package second surface 24 biased against portions of the heat slug first surface 82 so that the electronics package 20 is in thermal communication with the heat slug 90, which, in turn, may be in thermal communication with the pad 80 and, thence, with the pins 30 generally proximate the first ends 32. The electronics package 20, as illustrated, may be in electrical communication with the traces 70 by electrical connectors 72.

As illustrated in FIGS. 3A and 3B, the plurality of pins 30 may be disposed about the pad 80. The pins 30 pass through the PCB 10 including the core 50 generally from the core first surface 52 to the core second surface 54 to conduct heat from the first side 12 to the second side 14 of the PCB 10. In this implementation, heat generated by the electronics package 20 may be conducted from the package second surface 24 through the heat slug first surface 94 into the heat slug 90. Heat may be conducted from the heat slug second surface 94 through the pad first surface 82 into the pad 80 to generally distribute heat from the electronics package 20 throughout the heat slug 90 and the pad 80. Heat may be conducted into the pins 30 generally proximate the first ends 32 of the pins 30 from the pad 80 and/or the heat slug 90, and the pins 30 may conduct heat through the core 50 from the core first surface 52 to the core second surface 54 to allow the heat to be dispersed generally from the core second surface 54, which, in this implementation, defines the second surface 14 of the PCB 10.

In various implementations, the pins 30 may be configured to be in thermal communication with the pad 80 and/or with the heat slug 90 by being at least in part positioned proximate the pad 80 and/or heat slug 90, by passing through at least a portion of the pad 80 and/or heat slug 90, perhaps by being biased against or otherwise in mechanical contact with or soldered/welded to the pad 80 and/or the heat slug, or in other ways as would be readily recognized by those of ordinary skill in the art upon review of this disclosure, or combinations thereof. As illustrated in FIGS. 3A and 3B, portions of the pins 30 configured to be generally proximate the second ends 34 form extensions 36 to disperse heat, at least in part, by convection and/or radiation.

Figure 4A:
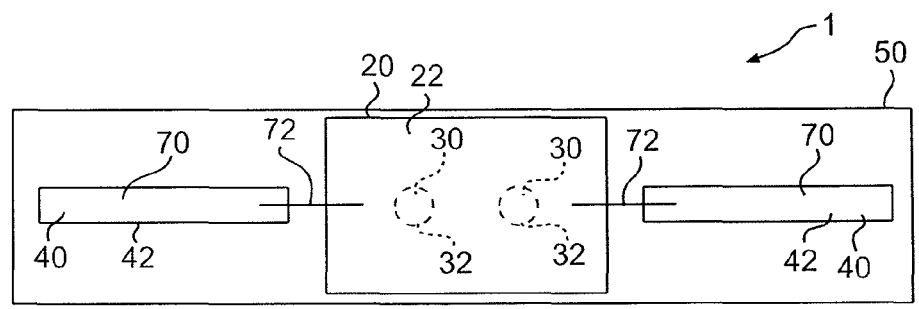
FIG. 4A illustrates in plan view an exemplary embodiment of an apparatus, configured according to principles of the invention.
Figure 4B:
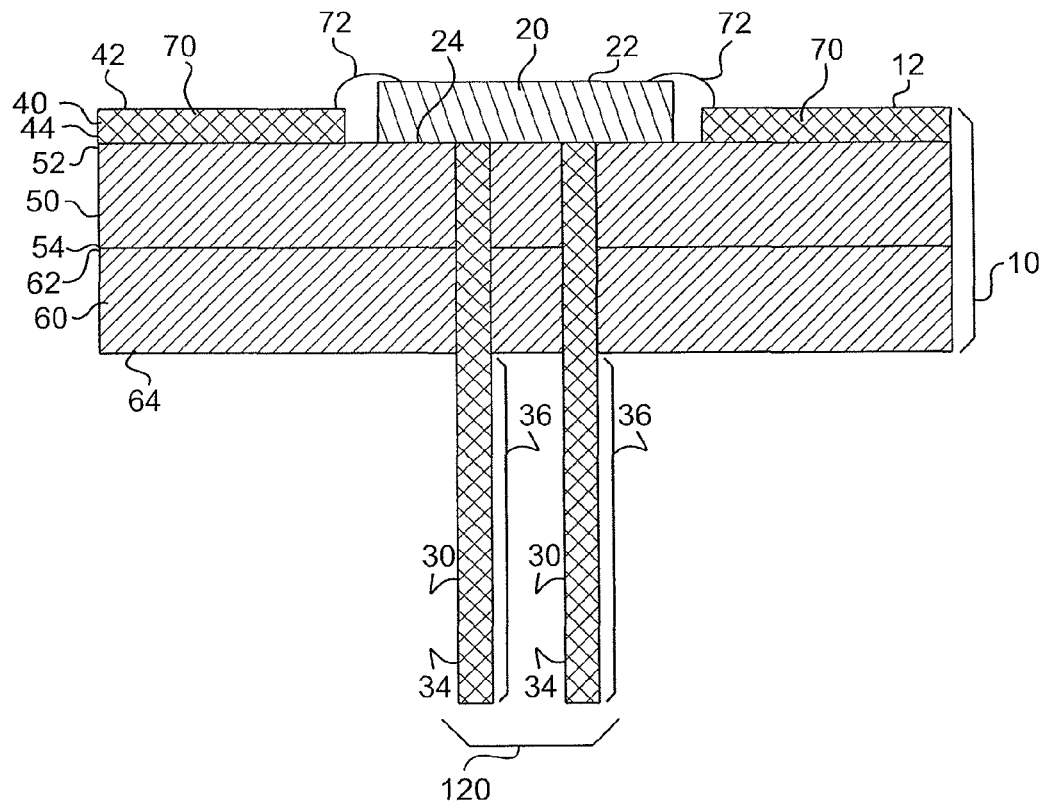
FIG. 4B illustrates in frontal view the embodiment of FIG. 4A.

FIGS. 4A and 4B generally illustrate a PCB 10 that includes the metal layer 40, the core 50, and the backplane 60, with backplane 60 comprising a heat conductive material such as, for example, a metal, graphite, or the like. The metal layer first surface 42 and portions of the core first surface 52 may be configured to generally define the first surface 12 of the PCB 10. The second surface 14 of the PCB 10 may be generally defined by the backplane second surface 64, as illustrated.

The electronics package 20 may be disposed about the first surface 12 of the PCB 10, as illustrated in FIGS. 4A and 4B, with portions of the package second surface 24 biased against portions of the core first surface 52 or soldered/welded thereto to transfer heat by conduction through the package second surface 24 to the core first surface 52. In other implementations, the package second surface 24 may be generally set apart, at least in part, from the core first surface 52 so that heat may be transferred by radiation and/or convection from the package second surface 24 to the core first surface 52. Traces 70 configured from the metal layer 40 may be disposed upon the core first surface 52, and the electronics package 20 may be in electrical communication with the traces 70 by electrical connectors 72, as illustrated.

The core 50 may be sandwiched between the metal layer 40 and the backplane 60, as illustrated in FIGS. 4A and 4B. The core 50, which may be a thermal and electrical insulator, may inhibit conduction of heat emitted by the electronics package 20 to the backplane 60 and, hence, may inhibit the dispersal of heat generated by the electronics package 20 from the backplane 60. As illustrated, pins 30 may be configured to pass through the core 50 from the core first surface 52 to the core second surface 54 and through the backplane 60 from the backplane first surface 62 to the backplane second surface 64 and beyond to conduct heat from the electronics package 30 to the backplane 60 in order to diffuse the heat generated by the electronics package 20 throughout the backplane 60. The first ends 32 of the pins 30 may be placed proximate the package second surface 24 to be in thermal communication with the package second surface 24 in order to conduct heat generated by the electronics package 20 from the package second surface 24 thru the core 50 from the core first surface 52 to the core second surface 54 and into the backplane 60. The backplane 60 may disperse the heat generally from the backplane second surface 64 by convection and/or radiation or the like.

As illustrated, portions of the pins 30, generally proximate the second ends 34, may define extensions 36 that protrude generally outward from the backplane second surface 64. Heat may be dispersed, at least in part, by convection and/or radiation from the extensions 36.

Figure 5A:
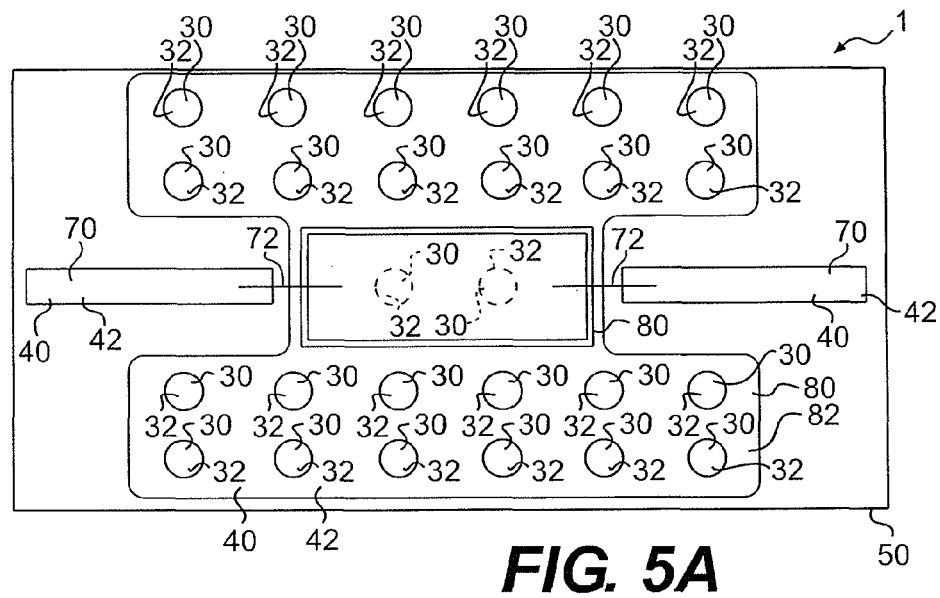
FIG. 5A illustrates in plan view an exemplary embodiment of an apparatus, configured according to principles of the invention.
Figure 5B:
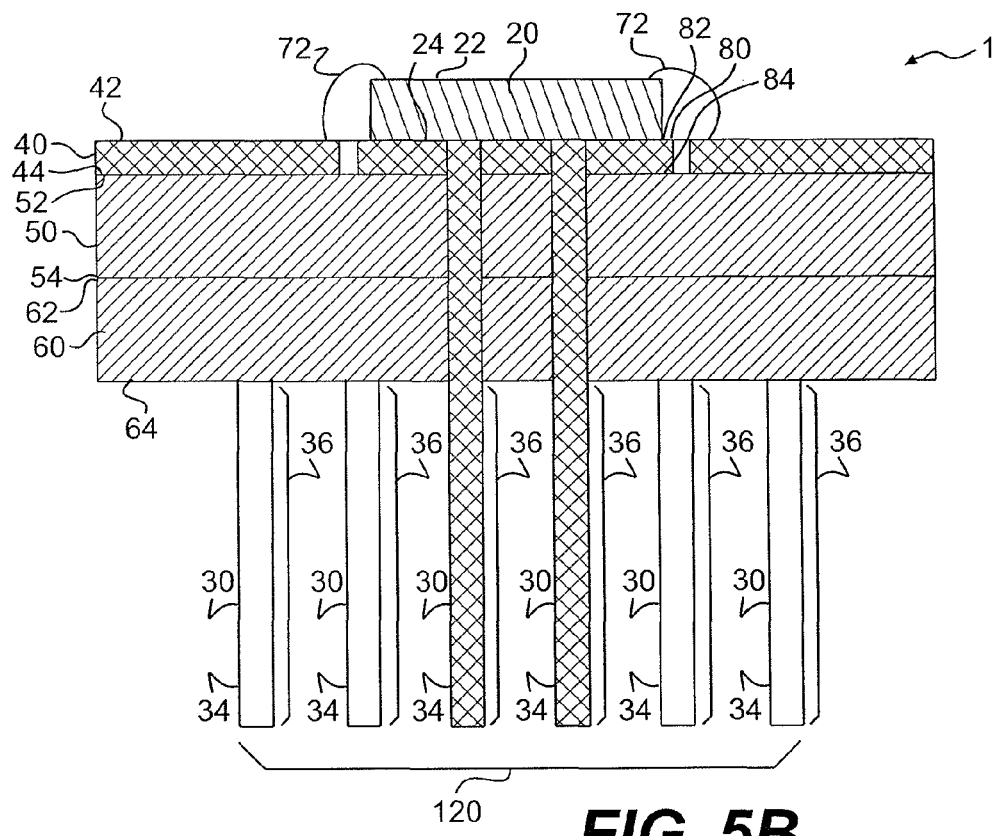
FIG. 5B illustrates in frontal view the embodiment of FIG. 5A.

FIGS. 5A and 5B generally illustrate a PCB 10 that includes the metal layer 40, the core 50, and the backplane 60. Backplane 60 may include a heat conductive material. Portions of the metal layer 40 may define traces 70, as illustrated. Other portions of the metal layer 40 may define a pad 80 having a pad first surface 82 and a pad second surface 84, with the pad 80 electrically isolated from the traces 70 in the illustrated implementation. The electronics package 20 may be disposed about the first surface 12 of the PCB 10, as illustrated in FIGS. 5A and 5B, with portions of the package second surface 24 generally abutting portions of the pad first surface 82 so that the electronics package 20 may be in thermal communication with the pad 80. Accordingly, heat generated by the electronics package 20 may be distributed throughout the pad 80.

As illustrated, pins 30 may be disposed about the pad 80 to conduct heat from the pad 80 through the core 50 and into the backplane 60 in order to disperse heat generated by the electronics package 20 from the backplane 60. The first ends 32 of the pins 30, in this implementation, may be located generally about the pad first surface 82 of the pad 80. The pins 30 may pass through the pad 80 generally from the pad first surface 82 to the pad second surface 84, through the core 50 from the core first surface 52 to the core second surface 54 and through the backplane 60 from the backplane first surface 62 to the backplane second surface 64 and extend outward faun the backplane second surface 64. The backplane 60 may disperse the heat generally from the backplane second surface 64 by convection and/or radiation. As illustrated, portions of the pins 30, generally proximate the second ends 34, protrude generally beyond the backplane second surface 64 to form extensions 36. Heat may be dispersed by convection and/or radiation from the extensions 36. The pins 30, in various implementations, may secure, or at least aid in securing, the backplane 60 to the core 50. In implementations wherein the backplane 60 includes graphite, the pins 30 may be advantageous for securing the graphite backplane 60 to the core. In various implementations, the pins 30 may have differing lengths. In various implementations, the second ends 24 may be configured to terminate within the backplane 60, or the second ends 34 of the pins 30 may be biased against the backplane first surface 62.

Figure 6A:
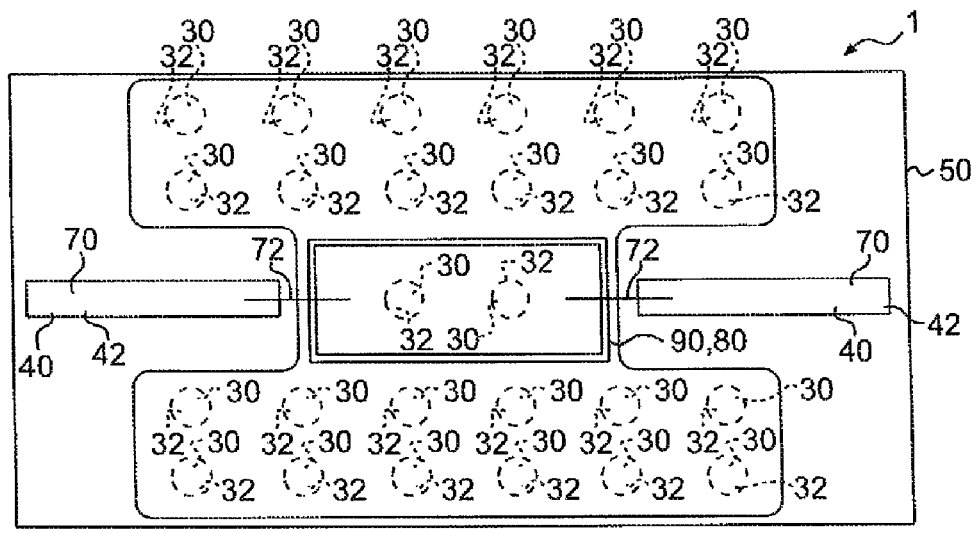
FIG. 6A illustrates in plan view an exemplary embodiment of an apparatus, configured according to principles of the invention.
Figure 6B:
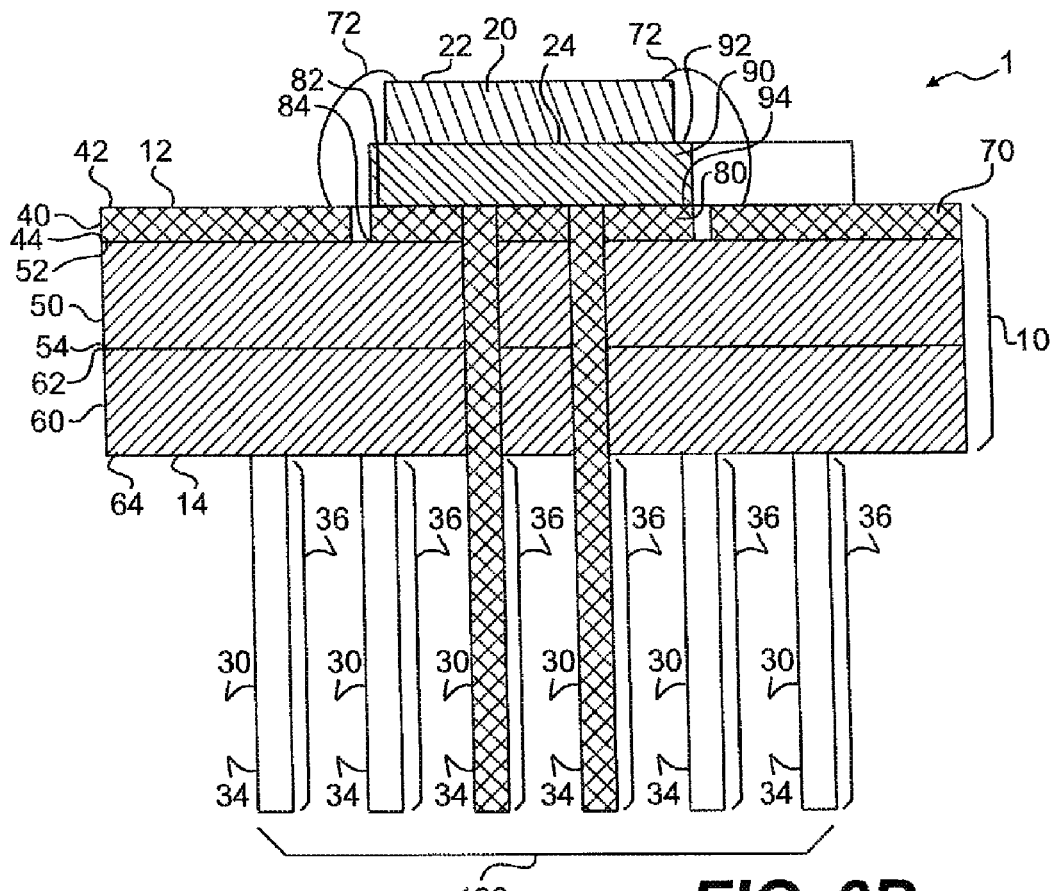
FIG. 6B illustrates in frontal view the embodiment of FIG. 6A.

FIG. 6A illustrates in plan view an exemplary embodiment of an apparatus, configured according to principles of the invention. FIG. 6B illustrates in frontal view of the embodiment of FIG. 6A. The implementation illustrated in FIGS. 6A and 6B includes a metal layer 40, a core 50, and a backplane 60. Backplane 60 may comprise a heat conductive material. Portions of the metal layer 40 may define traces 70, as illustrated, while other portions of the metal layer 40 may define pad 80. The pad 80 may be electrically isolated from the traces 70. Also, as illustrated in FIGS. 6A and 6B, a heat slug 90 having a first heat slug surface 92 and a second heat slug surface 94 may be secured to the pad 80 with the second heat slug surface 94 generally abutting the first pad surface 82. The electronics package 20 may be configured to be disposed about the first surface 12 of the PCB 10, as illustrated, with portions of the package second surface 24 biased against portions of the heat slug first surface 82 so that the electronics package 20 may be in thermal communication with the heat slug 90 to distribute heat generated by the electronics package 20 throughout the heat slug 90 and pad 80. Pins 30 may pass through the pad 80, the core 50, and the backplane 60 to conduct heat generated by the electronics package 20 from the pad 80 and heat slug 90 to the backplane 60 for dispersal. Heat may be dispersed, at least in part, by convection and/or radiation from the extensions 36 that form array 120 in this implementation.

Figure 7A:
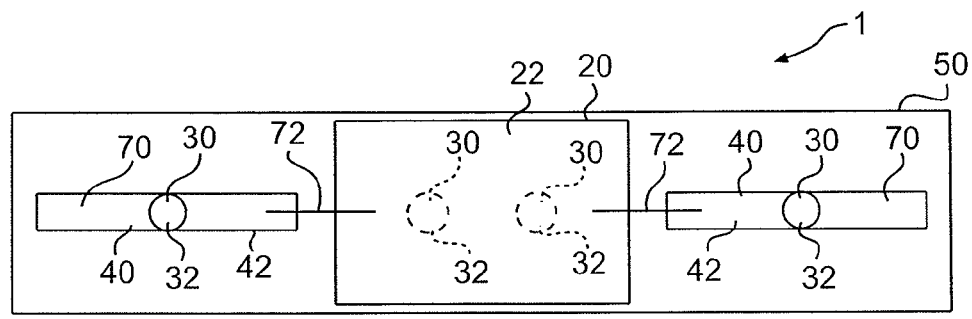
FIG. 7A illustrates in plan view an exemplary embodiment of an apparatus, configured according to principles of the invention.
Figure 7B:
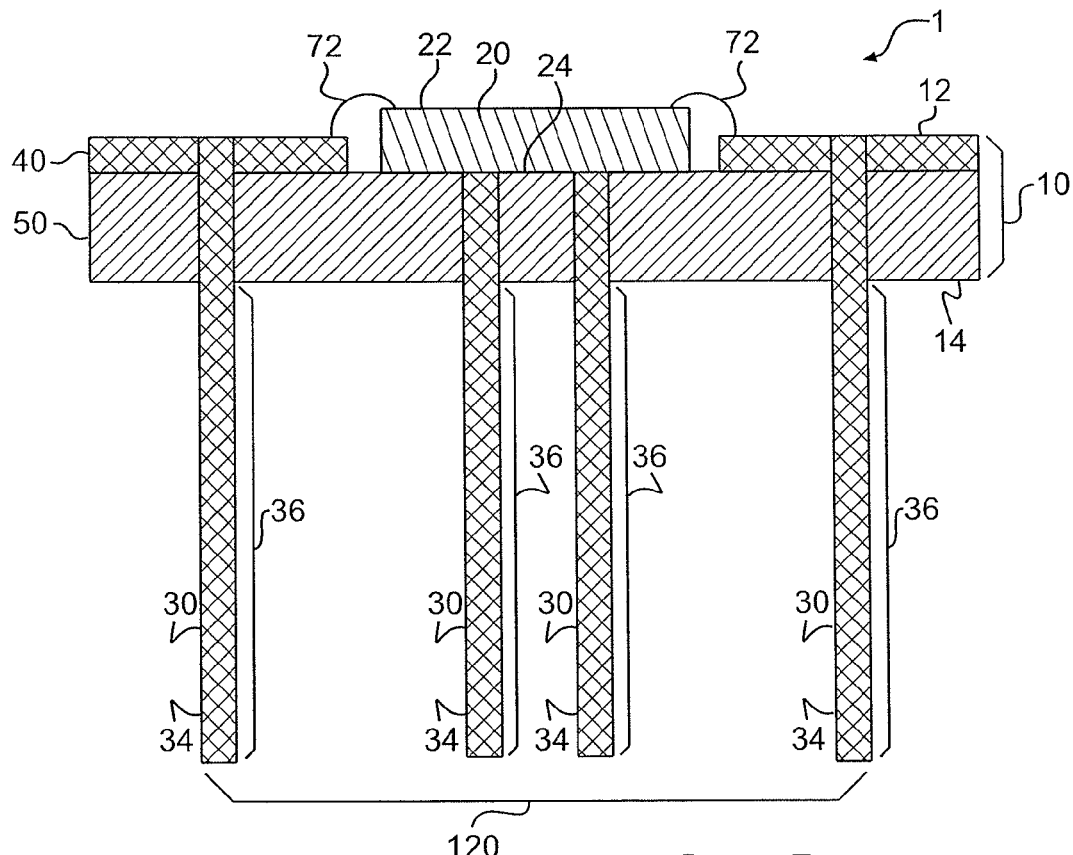
FIG. 7B illustrates in frontal view the embodiment of FIG. 7A.

FIG. 7A illustrates in plan view an exemplary embodiment of an apparatus, configured according to principles of the invention. FIG. 7B illustrates a frontal view of the embodiment of FIG. 7A. In this implementation, one or more pins 30 may be configured to pass at least partially through the trace(s) 70. As illustrated, the PCB 10 may include the metal layer 40 from which the traces 70 are configured, and the core 50. Pins 30 may be disposed about the electronics package 20 to conduct heat generated by the electronics package from the first surface 12 to the second surface 14 to be dispersed. Pins 30 that pass at least partially through the traces 70 may pass at least partially into the core 50. The core 50 may electrically isolate the pins 30 so that substantially no short circuiting may occur through the core 50 between pins 30 when having differing potentials.

In other implementations that include the pad 80, the pad 80 may be electrically charged in order to supply power to the electronics package 20. Pins 30 that may contact the pad 80 in such implementations would be electrically isolated by the core so that substantially no short circuiting occurs through the core 50 between pins 30 when having differing potentials.

Figure 8A:
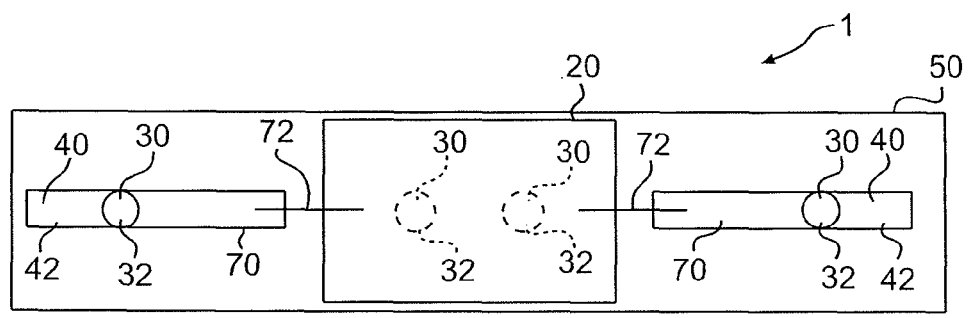
FIG. 8A illustrates in plan view an exemplary embodiment of an apparatus, configured according to principles of the invention.
Figure 8B:
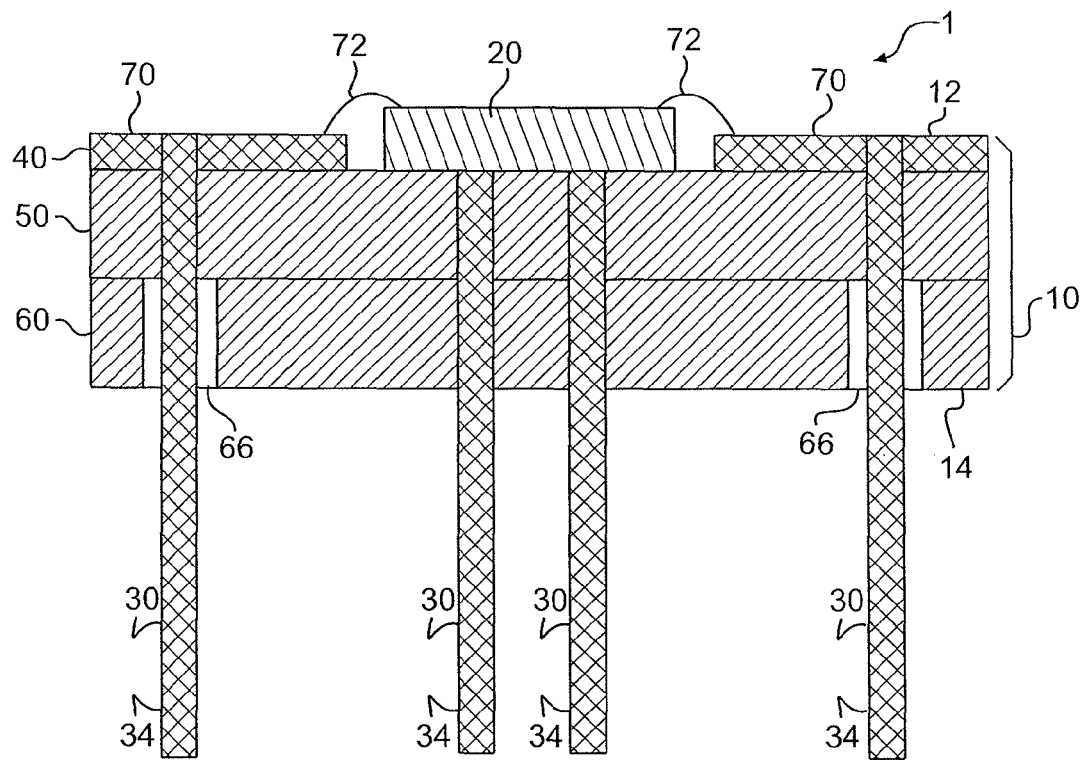
FIG. 8B illustrates in frontal view the embodiment of FIG. 8A.

FIG. 8A illustrates in plan view an exemplary embodiment of an apparatus, configured according to principles of the invention. FIG. 8B illustrates in frontal view the embodiment of FIG. 8A. One or more pins 30 may pass through the trace(s) 70, as illustrated in FIGS. 8A and 8B. Also, as illustrated, the PCB 10 may include the metal layer 40 from which the traces 70 may be configured, core 50, and backplane 60. Pins 30 may be disposed about the electronics package 20 to conduct heat generated by the electronics package from the first surface 12 to the second surface 14 for dispersal. Pins 30 that pass through the traces 70 may pass into the core 50. The core 50 may electrically isolate the pins 30 so that substantially no short circuiting occurs through the core 50 between pins 30, when they have differing potentials. As illustrated, the backplane 60 may include backplane cavities 66 that pass about respective pins 30 so that the pins 30 do not contact (i.e., are isolated from) the backplane 60 in order to prevent short circuiting between pins 30 through the backplane 60. The pins 30 may exchange heat with the backplane 60 by radiation and/or convection, and the pins 30 may also generally disperse heat through the portions of the pins 30 proximate the second ends 34 by radiation and/or convection in this implementation.

Because of the backplane cavities 66, the pins 30 do not directly contact the backplane 60, which may limit the heat conductance between the pins 30 and the backplane 60. In an alternative implementation, the pins 30 may be anodized, at least in part, so that the pins 30 are electrically non-conductive. The anodized pin 30 may pass through the trace 70, through the core 50 and into the backplane 60, perhaps with mechanical contact between the pins 30 and the backplane 60, to conduct heat generated by the electronics package from the first surface 12 to the backplane 60 without short circuiting. Similarly, in implementations wherein the pad 80 may be electrically charged, anodized pins 30 may contact the pad 80 and contact the backplane 60 without short circuiting.

Figure 9:
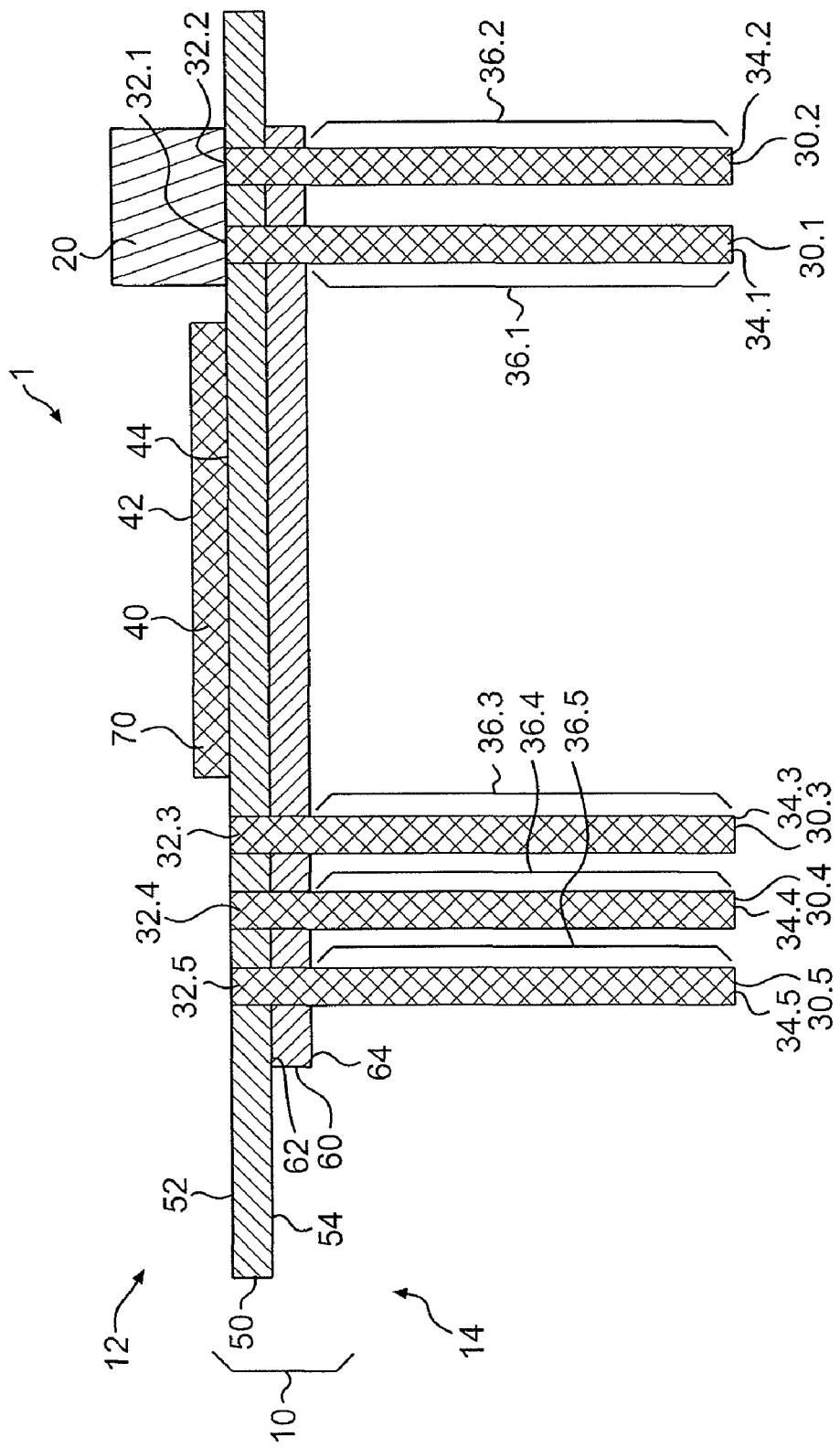
FIG. 9 illustrates a frontal view of an exemplary embodiment of an apparatus, configured according to principles of the invention.

FIG. 9 illustrates a frontal view of an exemplary embodiment of an apparatus, configured according to principles of the invention. As shown in this implementation, pins 30.1, 30.2 may pass thru the PCB 10 including the core 50 to conduct heat generated by the electronics package 20 generally from the first surface 12 to the second surface 14. The pins 30.1, 30.2 may be configured to be disposed proximate the electronics package 20 and configured to be in thermal communication with the electronics package 20 so that heat generated by the electronics package 20 may be conducted through the package second surface 24 into the pins 30.1, 30.2 generally proximate the first ends 32.1, 32.2. The pins 30.1, 30.2 may conduct heat through the core 50 from the core first surface 52 to the core second surface 54. The pins 30.1, 30.2 may pass through the backplane 60, and heat may be conducted from the pins 30.1, 30.2 into the backplane 60. The backplane 60, in this implementation, may include graphite which conducts heat anisotropically. The preferred directions for heat conduction in the backplane 60, in this implementation, are parallel to the planes defined by the backplane first surface 62 and the backplane second surface 64. Thus, the backplane 60 may conduct heat from pins 30.1, 30.2, to pins 30.3, 30.4, 30.5, and heat may be generally dispersed by convection and/or radiation from the extensions 36.3, 36.4, 36.5 that protrude beyond the backplane second surface 64. As illustrated, heat conducted through the core 50 from the electronics package 20 may be dispersed, at least in part, by convection and/or radiation from the extensions 36.1, 36.2.

Figure 10:
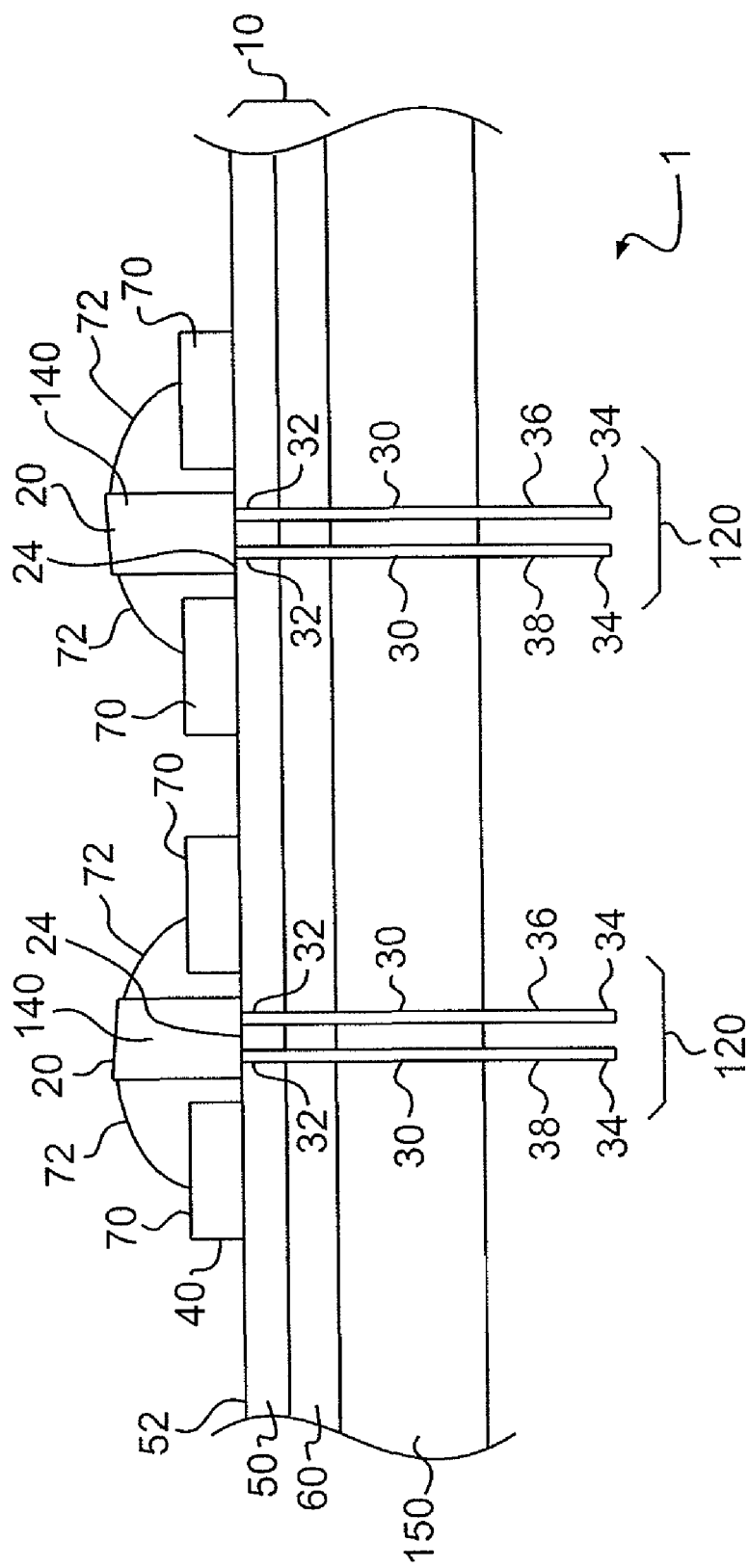
FIG. 10 illustrates a frontal view of an exemplary embodiment of an apparatus, configured according to principles of the invention.

FIG. 10 illustrates a frontal view of an exemplary embodiment of an apparatus, configured according to principles of the invention. An array of electronics packages 20 secured to the PCB 10 is illustrated in FIG. 10, wherein the electronics packages 20 are configured to include one or more light emitting diodes (LED's). The electronics package 20 may, for example, include three LED's adapted to provide red, green, and blue light, respectively in order to provide backlight for a liquid crystal display, for example. The PCB 10, as illustrated in FIG. 10, may be secured to a heat sink panel 150, which may include aluminum, copper, other heat conductive material or combinations thereof to absorb and dissipate heat generated by the electronics packages 20. Pins 30 may conduct heat generated by the electronics packages 20 through the PCB 10 to the heat sink panel 150.

As illustrated, the PCB 10 may be configured to include a metal layer 40, a core 50, and a backplane 60, with backplane 60 including a heat conductive material. Portions of the metal layer 40 may define traces 70, as illustrated. The electronics packages 20 may be disposed about the core first surface 62, as illustrated, with portions of the package second surface 24 generally abutting portions of the core first surface 52 and electrically connected to the traces 70 by electrical connectors 72.

As illustrated in FIG. 10, pins 30 may be disposed with first ends 32 configured proximate the package second surface 24 and second ends 34 within the heat sink panel 150 in order to conduct heat from the electronics package 20 through the core 50 and into the backplane 60 and into the panel heat sink 150. Heat may be distributed throughout the backplane 60 by conduction and heat may be conducted from the backplane 60 into the heat sink panel 150. The heat sink panel 150 may distribute the heat throughout by conduction, and may disperse heat by convection and/or radiation. In various implementations, the pins 30 may secure (or aid in securing), at least in part, the backplane 60 to the core 50 and may secure the heat sink panel 150 to the backplane 60. As would be understood by one of ordinary skill in the art upon review of this disclosure, the backplane 60 and heat sink panel 150 may be of a unitary construction in some implementations, or the backplane 60 and heat sink panel 150 may be secured to one another by welds, adhesives, and so forth. In various implementations, portions of the pins 30, generally proximate the second ends 34, may be configured to extend beyond the heat sink panel 150 to form an array 120 for the dispersal of heat. Heat may be dispersed from the array 120 by free convection or forced convection. The dispersal of heat by free convection may be particularly effective when the heat sink panel is placed in a vertical orientation so that air driven by buoyancy may flow through the array 120.

FIGS. 11A-11F each illustrate in perspective a separate exemplary embodiment of a pin, configured according to principles of the invention.

Figure 11A:
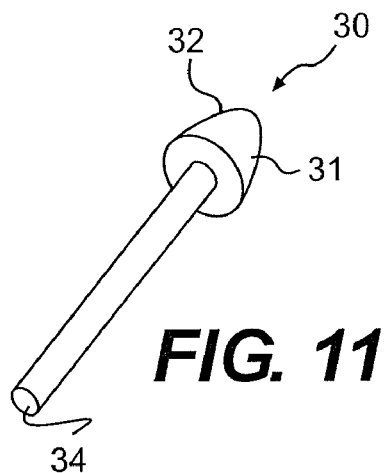
FIGS. 11A-11F each illustrate in perspective a separate exemplary embodiment of a pin, configured according to principles of the invention.
Figure 11B:
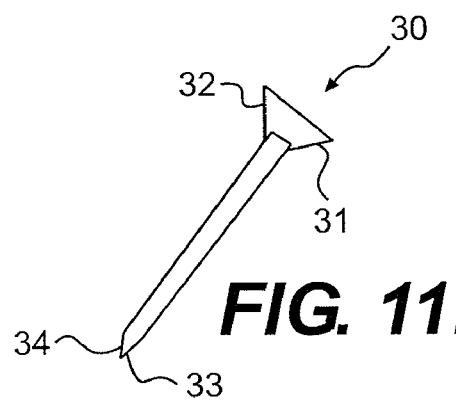
Figure 11C:
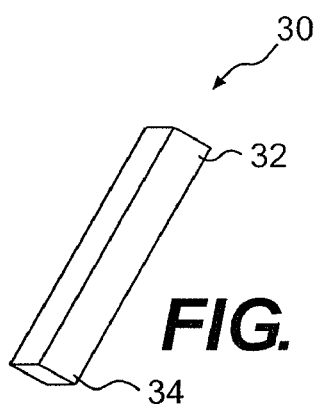
Figure 11D:
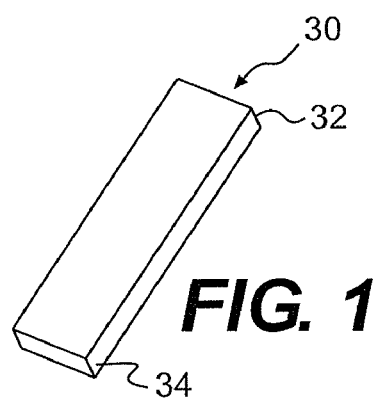
Figure 11E:
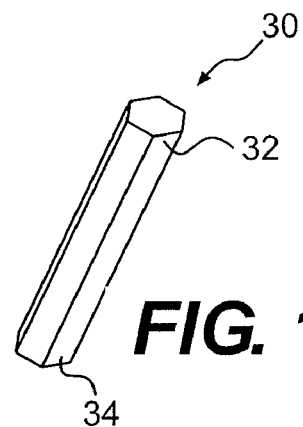
Figure 11F:
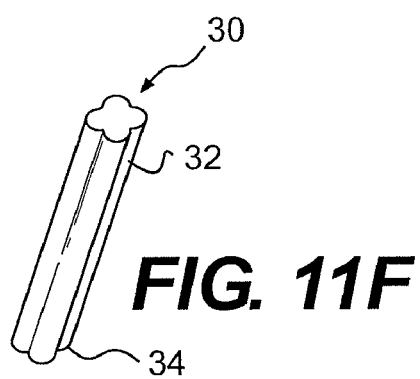

FIG. 11A illustrates a pin 30 configured to have a generally rounded head 31 at the first end 32. The pin 30 illustrated in FIG. 11B has a generally flat head 31 at the first end 32 and the second end 32 may be configured with a point 33. The pins 30 illustrated in FIGS. 11C, 11D, 11E, and 11F have generally square, generally rectangular, hexagonal, and star shaped cross-sections, respectively. The pin 30 may assume other shapes and configurations as would be recognized by those of ordinary skill in the art upon review of this disclosure.

Methods, in various aspects, may include arranging the apparatus 1, PCB 10, metal layer 40, core 50, and/or electronics package 20 with the pins 30. Further the method may include generating heat proximate the first surface 12 of the PCB 10 by an electronics package 20 and may include conducting the heat from the first surface 12 to the second surface 14, at least in part, using a plurality of pins 30. The methods may include dispersing heat from an array 120 defined by a plurality of extensions 36. The methods may include securing the backplane 60, at least in part by a plurality of pins 30.

In the apparatus described above, the electronic package 20 may be one or more lighting devices, computing devices, memory storage devices, communication devices, and the like. For example, the lighting devices may be LEDs and any associated electronics.

Further, with respect to the aspects described above, the apparatus 1 may be a light, a computer device, a storage device, a telecommunications device or the like, or any combination thereof.

While the invention has been described in terms of exemplary embodiments, those skilled in the art will recognize that the invention can be practiced with modifications in the spirit and scope of the appended claims. These examples given above are merely illustrative and are not meant to be an exhaustive list of all possible designs, embodiments, applications or modifications of the invention.

What is claimed is:

1. A circuit comprising:
a printed circuit board (PCB), the PCB defines a first surface and a second surface, the PCB includes a core, the core defines a first core surface and a second core surface;
an electronics package, the electronics package secured to the first surface of the PCB;
a plurality of pins, including a first pin and a second pin, each of the plurality of pins having a first end and a second end, the plurality of pins disposed about the PCB with the first pin proximate the electronics package such that a portion of the heat generated by the electronics package may be received by the first pin, the plurality of pins configured to pass through the core generally from the first core surface to the second core surface to conduct heat generated by the electronics package through the core for dissipation;
a metal layer forming at least one trace on the first core surface, and the first pin configured to pass through the at least one trace, the first pin electrically isolated from the second pin; and
a heat slug, wherein the metal layer forms a pad having a pad first surface and a pad second surface, and wherein the electronics package has a package first surface and a package second surface, wherein a portion of the package second surface abuts a portion of the pad first surface, and the heat slug secured to the pad so that the electronics package is in thermal communication with the heat slug and the plurality of pins.

2. The circuit according to claim 1, further comprising a backplane having a backplane first surface and a backplane second surface, the backplane first surface affixed to the core second surface.

3. The circuit of claim 2, wherein the backplane comprises an electrically conductive material.

4. The circuit of claim 1, wherein a cross-section of at least one of the plurality of pins is constant between the first end and the second end.

5. The circuit of claim 1, wherein a cross-section of at least one of the plurality of pins is tapered between the first end and the second end.

6. The circuit of claim 1, wherein a cross-section of at least one of the plurality of pins forms a non-circular shape.

7. The circuit of claim 1, wherein at least one of the plurality of pins is configured to be slideably received into the PCB.

8. The circuit according to claim 1, wherein the plurality of pins extend beyond the second core surface to define an extension portion, the extension portion dispersing the conducted heat by convection and/or radiation.

9. The circuit of claim 1, wherein the electronics package is in electrical communication with the at least one trace.

10. The circuit of claim 1, wherein the metal layer further forms a pad having a pad first surface and a pad second surface, the pad electrically isolated from the at least one trace.

11. The circuit of claim 1, wherein the electronics package is in thermal communication with the pad to distribute heat away from the electronics package.

12. The circuit of claim 11, wherein the plurality of pins pass through the pad to conduct heat away from the electronics package.

13. The circuit according to claim 1, further comprising a backplane having a backplane first surface and a backplane second surface, the backplane first surface affixed to the core second surface, the plurality of pins passing through at least a portion of the pad and through the core and into at least a portion of the backplane to dissipate heat.

14. The circuit of claim 1, wherein at least one of the plurality of pins is configured to pass at least partially through the at least one trace and the core, the core electrically isolating the at least one pin from at least one other of the plurality of pins.

15. The circuit of claim 1, wherein the electronics package includes at least one light emitting diode (LED).

16. The circuit of claim 1, wherein the electronics package comprises in any combination: one or more lighting devices, a computing device, a memory storage device, and a communication device.

17. A circuit comprising:
a printed circuit board (PCB), the PCB defines a first surface and a second surface, the PCB includes a core, the core defines a first core surface and a second core surface;
an electronics package, the electronics package secured to the first surface of the PCB;
a plurality of pins, including a first pin and a second pin, each of the plurality of pins having a first end and a second end, the plurality of pins disposed about the PCB with the first pin proximate the electronics package such that a portion of the heat generated by the electronics package may be received by the first pin, the plurality of pins configured to pass through the core generally from the first core surface to the second core surface to conduct heat generated by the electronics package through the core for dissipation;
a metal layer forming at least one trace on the first core surface, and the first pin configured to pass through the at least one trace, the first pin electrically isolated from the second pin; and
a backplane having a backplane first surface and a backplane second surface, the backplane first surface affixed to the core second surface, the plurality of pins passing through at least a portion of the pad and through the core and into at least a portion of the backplane to dissipate heat,
wherein the metal layer forms a pad having a pad first surface and a pad second surface, and wherein the electronics package has a package first surface and a package second surface, wherein a portion of the package second surface abuts a portion of the pad first surface.

* * * * *